(12) United States Patent
Oka et al.

(10) Patent No.: US 8,603,850 B2
(45) Date of Patent: Dec. 10, 2013

(54) METHOD FOR MANUFACTURING SOLAR CELL USING SILICON POWDER

(75) Inventors: Hiroaki Oka, Kanagawa (JP); Nariaki Oka, Kanagawa (JP)

(73) Assignee: Sanki Dengyo Co., Ltd., Yokohama-shi (JP)

( * ) Notice: Subject to any disclaimer, the term of this patent is extended or adjusted under 35 U.S.C. 154(b) by 0 days.

(21) Appl. No.: 13/591,628

(22) Filed: Aug. 22, 2012

(65) Prior Publication Data

US 2013/0045559 A1 Feb. 21, 2013

Related U.S. Application Data

(63) Continuation of application No. PCT/JP2011/054255, filed on Feb. 25, 2011.

(30) Foreign Application Priority Data

Feb. 25, 2010 (JP) .................................. 2010-039497

(51) Int. Cl.
*H01L 21/00* (2006.01)
*H01L 21/324* (2006.01)
*H01L 21/477* (2006.01)

(52) U.S. Cl.
USPC 438/61; 438/795; 257/E21.324; 257/E21.497

(58) Field of Classification Search
USPC ............... 438/61, 610, 781, 795, FOR. 348, 438/FOR. 407; 257/E21.324, E21.497
See application file for complete search history.

(56) References Cited

U.S. PATENT DOCUMENTS

| 5,593,532 A * | 1/1997 | Falk et al. ...................... 156/285 |
| 8,394,728 B2 * | 3/2013 | Akao et al. ...................... 438/781 |
| 8,405,183 B2 * | 3/2013 | Straboni ........................ 257/463 |
| 2008/0305619 A1 * | 12/2008 | Lemmi et al. ................. 438/492 |

FOREIGN PATENT DOCUMENTS

| JP | 2002-151713 A | 5/2002 |
| JP | 2009-246041 A | 10/2009 |
| JP | 2011-116616 A | 6/2011 |

OTHER PUBLICATIONS

International Search Report for PCT/JP2011/054255, mailing date of May 17, 2011.

* cited by examiner

*Primary Examiner* — Calvin Choi
(74) *Attorney, Agent, or Firm* — Westerman, Hattori, Daniels & Adrian, LLP

(57) ABSTRACT

To provide a method for manufacturing a solar cell, whereby solar cells can be mass-produced by a simple process at low cost. A first conductivity-type silicon powder (11) is prepared, a silicon powder layer (11a) is formed by disposing the powder in the form of a layer, the powder layer is melted by heating the powder layer to the melting point of silicon or higher, and a first conductivity-type silicon layer (11b) is formed by cooling the melted layer. A second conductivity-type silicon powder (12) is prepared, a second conductivity-type silicon powder layer (12a) is formed by disposing the powder in the form of a layer on the first conductivity-type silicon layer (11b), the powder layer is melted by heating the powder layer to the melting point of silicon or higher, and a second conductivity-type silicon layer (12b) is formed by cooling the melted layer.

6 Claims, 2 Drawing Sheets

METHOD FOR MANUFACTURING SOLAR CELL USING SILICON POWDER

TECHNICAL FIELD

The invention relates to a method for manufacturing a solar cell that uses silicon powder as raw material.

BACKGROUND ART

As a form of the silicon solar cell, single-crystal silicon type, poly-crystal silicon type, micro-crystal silicon type, or amorphous silicon type etc. is known in the past. In these types, high purity silicon wafer is used as a semiconductor substrate, or silicon film is formed on an insulative or conductive substrate by using CVD method or vapor deposition method, and PN junction or PIN junction is formed.

SUMMARY OF INVENTION

Technical Problem

Now, popularization of the solar cell is requested from view points of global warming prevention etc. However, it is well-known that the cost decrease is a problem.

The object of the invention is to provide a method for manufacturing a solar cell, whereby solar cells can be mass-produced by a simple process at low cost.

Solution to Problem

The method for manufacturing a solar cell comprises holding a first conductivity-type silicon powder in a first holding section and holding a second conductivity-type silicon powder in a second holding section; sending a transparent insulation foil and a transparent electrode foil adhered thereto below the holding sections at fixed velocity on a plate by a belt, openings being provided at bottom of the holding sections, and disposing the first conductivity-type silicon powder in form of layer on the transparent electrode foil adhered to the transparent insulation foil from the opening; heating first conductivity-type silicon powder layer and second conductivity-type silicon powder layer on the plate, which is internally provided with water-cooling piping and vacuum adsorption piping, while adsorbing the insulation foil and the electrode foil with vacuum adsorption piping, and cooling the insulation foil and the electrode foil with cooling water in water-cooling piping; melting the first conductivity-type powder layer by heating to melting point of silicon or higher and cooling the melted layer to form a first conductivity-type silicon layer, or firing the first conductivity-type powder layer while compressing by applying heat and pressure to form a first conductivity-type silicon layer; disposing the second conductivity-type silicon powder on the first conductivity-type silicon layer when the first conductivity-type silicon layer moves below the second holding section, and forming second conductivity-type silicon powder layer in form of layer on the first conductivity-type silicon layer when the opening is passed; melting the second conductivity-type powder layer by heating to melting point of silicon or higher and cooling the melted layer to form a second conductivity-type silicon layer, or firing the second conductivity-type powder layer while compressing by applying heat and pressure to form a second conductivity-type silicon layer, and forming PN junction at interface of both layers; and disposing an electrode foil on upper surface of the second conductivity-type silicon layer, adhering the foil on upper surface of the second conductivity-type silicon layer by applying heat with a heater, and continuously forming solar cell fixed on the transparent insulation foil.

According to the invention, solar cells can be continuously manufactured from silicon powders. Since by sending the transparent insulation foil and the transparent electrode foil adhered thereto at fixed velocity on the plate by the belt, forming first conductivity type silicon powder layer, melting the powder layer by applying heat and forming first conductivity type silicon layer by cooling, forming second conductivity type silicon powder layer on the silicon layer, melting the powder layer by applying heat and forming second conductivity type silicon layer by cooling, the solar cell that is provided with PN junction can continuously be manufactured in a simple process. Moreover, the powder layer may be fired while compressing by applying heat and pressure.

DESCRIPTION OF EMBODIMENTS

Figure 1:
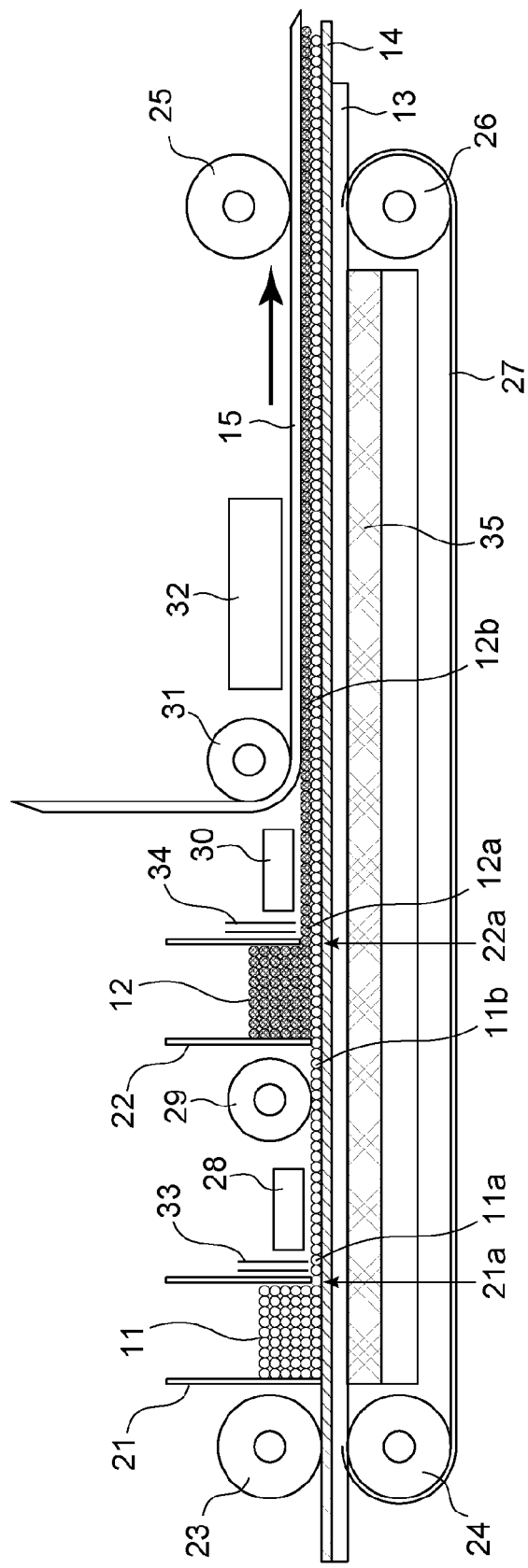
FIG. 1 is a cross-sectional view of manufacturing system of the solar cell according to first embodiment of the invention.

First embodiment of the invention will be described below with referring to FIG. 1. First, P type silicon powder 11 and N type silicon powder 12 are prepared. Silicon particle of powders 11,12 is roughly globular, having diameter of about 0.1-10 µm and having purity of solar cell class (seven nine level). These powders 11, 12 can be mass-produced according to manufacturing method for high purity silicon using rotation cubicle by inventors of the invention (Japanese Patent Application 2010-35714) and so on.

P-type silicon powder 11 is held in holding section 21 and N-type silicon powder 12 is held in holding section 22. Below holding sections 21,22, transparent insulation foil 13 and transparent electrode foil 14 adhered to foil 13 are sent in direction of an arrow in the figure at fixed velocity on plate 35 by roller 23, 24, 25, and 26 and heatproof metal belt 27. Openings 21a,22a are provided at bottom of holding sections 21,22, and P-type silicon powder 11 is disposed in form of layer on transparent electrode foil 14 adhered to transparent insulation foil 13 from opening 21a.

P-type silicon powder layer 11a disposed on transparent electrode foil 14 in form of layer is sent in direction of the arrow in the figure, heated just below heater 28, and heated to 600-1350° C. that is lower than melting point of silicon (1412° C.). And, pressure is added by rolling roller 29 and P-type silicon powder layer 11a in state of heat applied is fired while being compressed. Then P-type silicon powder layer 11a is compressed and fired by applying heat and pressure, and becomes sintered P-type silicon layer 11b. In P-type silicon layer 11b, since silicon particles that have grain diameter of about 0.1-10 µm are mutually bonded by diffusion bonding, electrically and mechanically strong state of joint has been formed.

When P-type silicon layer 11b moves below holding section 22, N-type silicon powder 12 is disposed on P type silicon layer 11b, and when opening 22a is passed, N-type silicon powder layer 12a is formed in form of layer on P-type silicon layer 11b. And, the layer 12a is heated just below heater 30 to 600-1350° C., and pressure is applied by rolling roller 31. As a result, N-type silicon powder layer 12a is fired while being compressed, the layer 12a becomes sintered N type silicon layer 12b, and silicon particles are mutually bonded by diffusion bonding. At the same time, the silicon particles in N-type silicon layer 12b becomes bonded to silicon particles in P-type silicon layer 11b by diffusion bonding, and PN junction is formed at interface of both layers.

Electrode foil 15 (aluminum foil or copper foil, etc.) is disposed on upper surface of N-type silicon layer 12b, and adhered to the upper surface of N-type silicon layer 12b by applying heat with heater 32. As a result, PN junction is formed between P-type silicon layer 11b and N-type silicon layer 12b, both layers 11b and 12b are disposed between electrode foils 14 and 15, and solar cell fixed on transparent insulation foil 13 is continuously formed.

Therefore, solar panel can be mass-produced by cutting the solar cell out by a suitable size. By adjusting thickness of the solar panel to about 40 μm or less as a whole, it is possible to make the solar panel light and flexible. It is preferable that manufacturing process of the solar cell is carried out under vacuum or inert gas atmosphere such as Ar.

In the above embodiment, pre-doped P-type silicon powder 11 and N-type silicon powder 12 are used as raw material. However, non-doped silicon powder may be used by adding dopants from dopant-injection port 33,34 and doping to P-type or N-type in process of compressing and firing.

Moreover, I-type silicon layer, which is made from non-doped silicon powder by being compressed and sintered, may be formed between P-type silicon layer 11b and N-type silicon layer 12b, and PIN-type junction may be formed therebetween.

Figure 2:
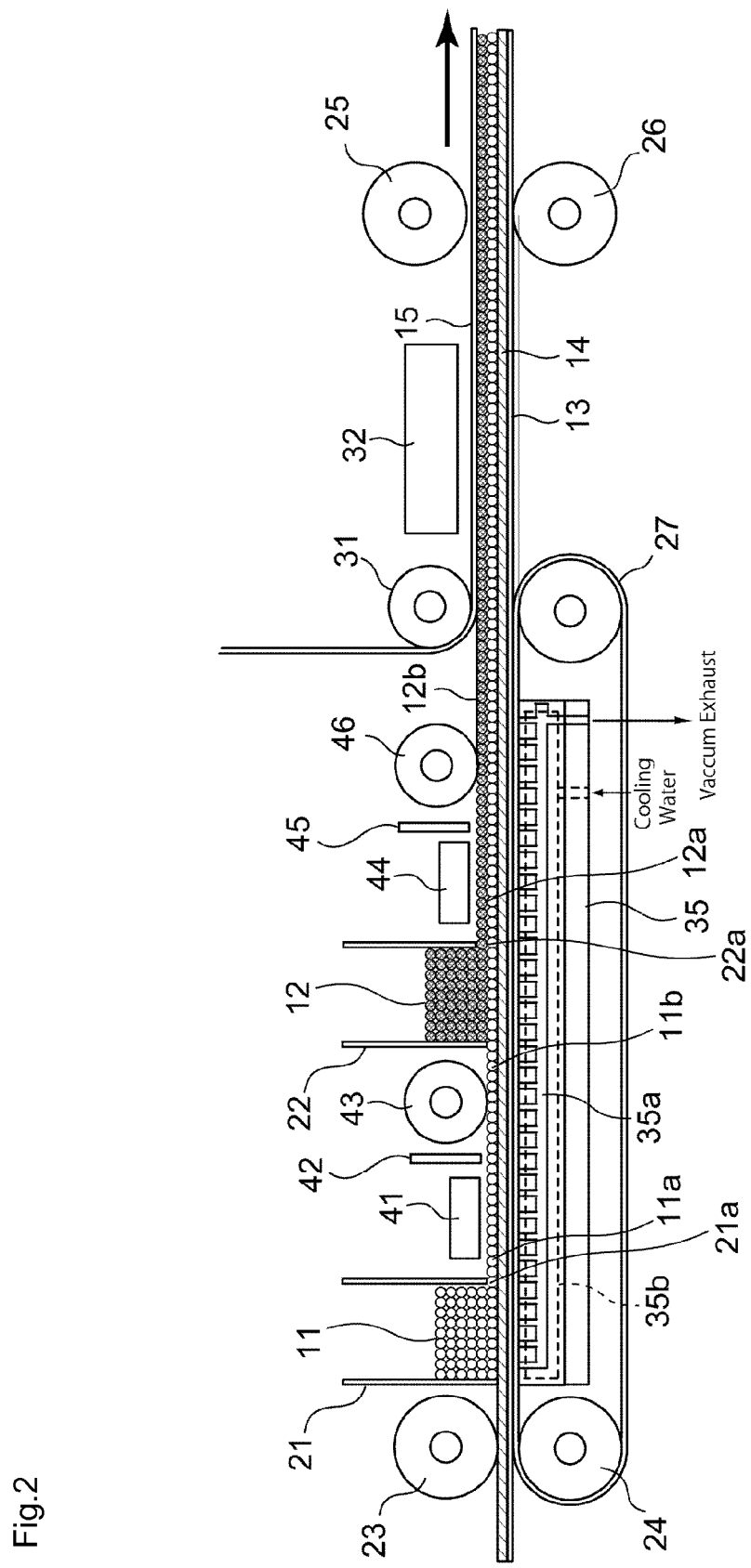
FIG. 2 is a cross-sectional view of manufacturing system of the solar cell according to second embodiment of the invention.

Next, second embodiment of the invention will be described below with referring to FIG. 2. It is similar to the first embodiment that P-type silicon powder 11 and N-type silicon powder 12 are prepared, and below holding sections 21,22 holding these powders, transparent insulation foil 13 and transparent electrode foil 14 adhered thereto are sent in direction of an arrow in the figure at fixed velocity on plate 35 by rollers 23, 24, 25, 26 and belt 27. Therefore, P-type silicon powder layer 11a is disposed in form of layer from opening 21a on transparent electrode foil 14 adhered to transparent insulation foil 13, and N-type silicon powder layer 12a is disposed in form of layer from opening 22a on P-type silicon layer 11b.

When P-type silicon powder layer 11a has entered below heater 41, the powder layer 11a is pre-heated to 1300-1400° C., and is heated to 1500° C. or more that is over than melting point of silicon (1412° C.) by laser heating with laser irradiation device 42. As a result, temperature of powder layer 11a rises gradually by preliminary heating, then bubbles etc. are removed, and the powder layer 11a melts by laser irradiation exceeding the melting point and it enters state of liquid phase. And, by being cooled with liquid nitrogen or water cooling roller 43, the layer becomes P-type silicon layer 11b of solid phase. Silicon of P-type silicon layer 11b comprises monocrystal or poly-crystal or amorphous.

Next, N-type silicon powder layer 12a is formed on P-type silicon layer 11b at holding section 22 of N type silicon powder 12. And, as well as described above, the powder layer 12a is pre-heated by heater 44, is melted by laser irradiation of laser irradiation device 45 to enter into state of liquid phase, is cooled by cooling roller 46, and becomes N-type silicon layer 12b of solid phase. At the same time, PN junction is formed at interface between P-type silicon layer 11b and N-type silicon layer 12b.

Plate 35 is internally provided with water-cooling piping 35a and vacuum adsorption piping 35b, and while adsorbing insulation foil 13 and electrode foil 14 with vacuum adsorption piping 35b, insulation foil 13 and electrode foil 14 are cooled by cooling water in water-cooling piping 35a. Therefore, silicon powder layer 11a and 12a are formed on electrode foil 14 adhered to insulation foil 13, and even if silicon powder layer 11a and 12a are heated at temperature of 1500° C. or more by laser irradiation, temperature of insulation foil 13 and electrode foil 14 is kept at temperature of cooling water, and these are never damaged.

As a result, by disposing electrode foil 15 on N-type silicon layer 12b after it's forming, and by heating with heater 32, electrode foil 15 can be adhered on N-type silicon layer 12b, and the solar cell, which is provided with P-type and N-type silicon layers 11b,12b between electrode foils 14,15, can be produced in a simple process.

Although embodiments of the invention has been described, however the invention is not limited to the embodiments, and various changes and modifications may be made within scope of the technical concept of the invention.

INDUSTRIAL APPLICABILITY

The invention enables to manufacture solar cell from silicon powder. As a result, the solar cells can be mass-produced by a simple process at low cost.

The invention claimed is:

1. A method for manufacturing a solar cell, comprising:
holding a first conductivity-type silicon powder in a first holding section and holding a second conductivity-type silicon powder in a second holding section;
sending a transparent insulation foil and a transparent electrode foil adhered thereto below the holding sections at fixed velocity on a plate by a belt, openings being provided at bottom of the holding sections, and disposing the first conductivity-type silicon powder in form of layer on the transparent electrode foil adhered to the transparent insulation foil from the opening;
heating first conductivity-type silicon powder layer and second conductivity-type silicon powder layer on the plate, which is internally provided with water-cooling piping and vacuum adsorption piping, while adsorbing the insulation foil and the electrode foil with vacuum adsorption piping, and cooling the insulation foil and the electrode foil with cooling water in water-cooling piping;
melting the first conductivity-type powder layer by heating to melting point of silicon or higher and cooling the melted layer to form a first conductivity-type silicon layer, or firing the first conductivity-type powder layer while compressing by applying heat and pressure to form a first conductivity-type silicon layer;
disposing the second conductivity-type silicon powder on the first conductivity-type silicon layer when the first conductivity-type silicon layer moves below the second holding section, and forming second conductivity-type silicon powder layer in form of layer on the first conductivity-type silicon layer when the opening is passed;
melting the second conductivity-type powder layer by heating to melting point of silicon or higher and cooling the melted layer to form a second conductivity-type silicon layer, or firing the second conductivity-type powder layer while compressing by applying heat and pressure to form a second conductivity-type silicon layer, and forming PN junction at interface of both layers; and
disposing an electrode foil on upper surface of the second conductivity-type silicon layer, adhering the foil on upper surface of the second conductivity-type silicon layer by applying heat with a heater, and continuously forming solar cell fixed on the transparent insulation foil.

2. The method according to claim 1, wherein the first conductivity-type silicon powder layer and the second conductivity-type silicon powder layer are heated below heaters.

3. The method according to claim 1, wherein particle of the silicon powder has diameter of 0.1-10 μm.

4. The method according to claim 1, wherein pressure is added by rolling roller to the first conductivity-type silicon powder layer and to the second conductivity-type silicon powder layer.

5. The method according to claim 1, wherein silicon particle of the powder is pre-doped to P-type or N-type beforehand.

6. The method according to claim 1, wherein silicon particle of the powder is non-doped, and is doped to P-type or N-type by adding dopant in the process of applying heat.

\* \* \* \* \*